(12) United States Patent
Swaminathan et al.

(10) Patent No.: US 9,054,687 B2
(45) Date of Patent: Jun. 9, 2015

(54) VCO WITH LINEAR GAIN OVER A VERY WIDE TUNING RANGE

(71) Applicant: QUALCOMM Incorporated, San Diego, CA (US)

(72) Inventors: Ashok Swaminathan, Cardiff, CA (US); Ian Galton, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/954,277

(22) Filed: Jul. 30, 2013

(65) Prior Publication Data

US 2015/0035611 A1 Feb. 5, 2015

(51) Int. Cl.
*H03K 3/282* (2006.01)
*H03K 3/354* (2006.01)

(52) U.S. Cl.
CPC ...................................... *H03K 3/354* (2013.01)

(58) Field of Classification Search
CPC .................................................... H03K 3/2821
USPC ............................................. 331/113 R, 144
See application file for complete search history.

(56) References Cited

U.S. PATENT DOCUMENTS

| | | | | |
|---|---|---|---|---|
| 4,692,718 | A * | 9/1987 | Roza et al. | 331/113 R |
| 6,157,268 | A * | 12/2000 | Ueno | 331/113 R |
| 6,198,358 | B1 * | 3/2001 | Tchamov et al. | 331/113 R |
| 6,201,450 | B1 | 3/2001 | Shakiba et al. | |
| 6,377,129 | B1 | 4/2002 | Rhee et al. | |
| 7,002,423 | B1 | 2/2006 | Drakhlis et al. | |
| 7,176,737 | B2 | 2/2007 | Baker et al. | |
| 7,298,183 | B2 | 11/2007 | Mirzaei et al. | |
| 7,315,220 | B1 | 1/2008 | Robinson et al. | |
| 8,207,763 | B1 | 6/2012 | In et al. | |

OTHER PUBLICATIONS

International Search Report and Written Opinion—PCT/US2014/048361—ISA/EPO—Oct. 31, 2014. (13 total pages).
Santin E., et al., "Fully integrated and reconfigurable architecture for coherent self-testing of IQ ADCs", IEEE International Symposium on Circuits and Systems, ISCAS 2010—May 30-Jun. 2, 2010—Paris, France, IEEE, US, May 30, 2010, pp. 1927-1930, XP031725237, ISBN: 978-1-4244-5308-5.

* cited by examiner

*Primary Examiner* — Joseph Chang
(74) *Attorney, Agent, or Firm* — Arent Fox LLP

(57) ABSTRACT

An oscillating circuit with linear gain is presented. The oscillating circuit may include a relaxation oscillator and a current compensation block. The relaxation oscillator includes a capacitor, a pair of resistors operative to deliver a first current to the capacitor, and a first current source adapted to generate the first current having a first predefined level. The current compensation block includes a second current source, and a pair of cross-coupled transistors coupled to the second current source and adapted to steer a current exceeding the first predefined level in the relaxation oscillator away from the capacitor and to the second current source. The proposed oscillating circuit generates an output signal which has a linear gain over a wide tuning range.

19 Claims, 5 Drawing Sheets

VCO WITH LINEAR GAIN OVER A VERY WIDE TUNING RANGE

BACKGROUND

The present disclosure relates to electronic circuits, and more particularly to voltage controlled oscillators (VCOs).

A voltage controlled oscillator (VCO) is an electronic oscillator whose oscillation frequency is controlled by a voltage input. The input voltage may determine the instantaneous oscillation frequency. A VCO may also be connected to a phase-locked loop (PLL) circuit. In general, oscillators can be designed with a very large frequency range. However, oscillator gain tends to be nonlinear across the whole frequency range. For example, an LC VCO (in which L represents an inductor and C represents a capacitor) could have up to 10× change in VCO gain over a 3× frequency range. Similar issues may arise in ring oscillators. VCO gain may also be sensitive to variations in process, voltage and temperature (PVT). It should be noted that wide variations in VCO gain may lead to variations in PLL bandwidth which may result in large jitter variations over PLL range.

Techniques are known in the art to compensate the nonlinearities in the VCO gain, such as gain estimation and correction for digital PLLs (also known as Veyron PLL), matching VCO gain variations with charge pump current variations (e.g., in replica biased ring oscillators), and the like. However, these techniques may rely on correction of the nonlinearities in the VCO output in the PLL. It is therefore desirable to implement VCOs with linear gain over a very wide tuning range.

SUMMARY

An oscillating circuit, in accordance with one embodiment of the present invention includes, in part, a relaxation oscillator and a current compensation block. The relaxation oscillator may include, in part, a capacitor, a pair of resistors operative to deliver a first current to the capacitor, and a first current source adapted to generate the first current having a first predefined level. The current compensation block includes, in part, a second current source, and a first pair of cross-coupled transistors coupled to the second current source and adapted to steer a current exceeding the first predefined level in the relaxation oscillator away from the capacitor and to the second current source.

The first pair of cross-coupled transistors in the current compensation block include, in part, a first transistor having a source terminal coupled to the second current source, a drain terminal coupled to a first terminal of a first one of the resistors and a gate terminal coupled to a first terminal of a second one of the resistors, and a second transistor having a source terminal coupled to the second current source, a gate terminal coupled to the first terminal of the first resistor and a drain terminal coupled to the first terminal of the second resistor.

In one embodiment, the oscillating circuit further includes a second pair of cross-coupled transistors forming a comparator. A first transistor of the second pair of cross-coupled transistors has a source terminal coupled to a first terminal of the capacitor, a gate terminal coupled to a first terminal of a second one of the resistors and a drain terminal coupled to a first terminal of a first one of the resistors. A second transistor of the second pair of transistors has a source terminal coupled to a second terminal of the capacitor, a gate terminal coupled to the first terminal the first resistor and a drain terminal coupled to a first terminal of the second resistor.

In one embodiment, the compensation block is adapted to maintain a voltage across the capacitor to a value defined by a resistance of the pair of resistors and the first predefined current level.

A method for linearizing output of a relaxation oscillator, in accordance with one embodiment of the present invention includes, in part, delivering a first component of a current having a value up to a predefined level to a capacitive element disposed in the relaxation oscillator, and steering a second component of the current exceeding the predefined level away from the capacitive element.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

For circuit elements known as Voltage-Controlled Oscillators (VCOs), the voltage-frequency gain is very critical. The voltage-frequency gain directly affects bandwidth of a phase lock loop (PLL), which in turn affects the integrated noise or jitter of the PLL. In most LC and ring oscillator structures, VCO gain may vary by an order of magnitude over process-voltage and temperature (PVT) variations and tuning range. The tuning range refers to the difference between minimum and maximum frequencies that are supported by the VCO.

In general, design of relaxation oscillators or VCOs may involve adjusting the current, resistive load and capacitor values. Typically, these methods will only result in a constant VCO gain characteristic over a very small frequency range relative to the oscillator frequency. Therefore, the oscillator may illustrate nonlinear behavior in other frequencies.

Nonlinearities in the VCO gain over larger frequency ranges may be compensated using different methods. For example, PLL parameters may be adjusted based on estimated gain of the VCO. Another method may be cancelling out gain variations in the VCO using adaptive biasing of the VCO and charge pumps (CPs). However, these methods may be costly in hardware. Certain embodiments of the present disclosure propose a method for designing a VCO with linear gain over a wide tuning range.

Figure 1:
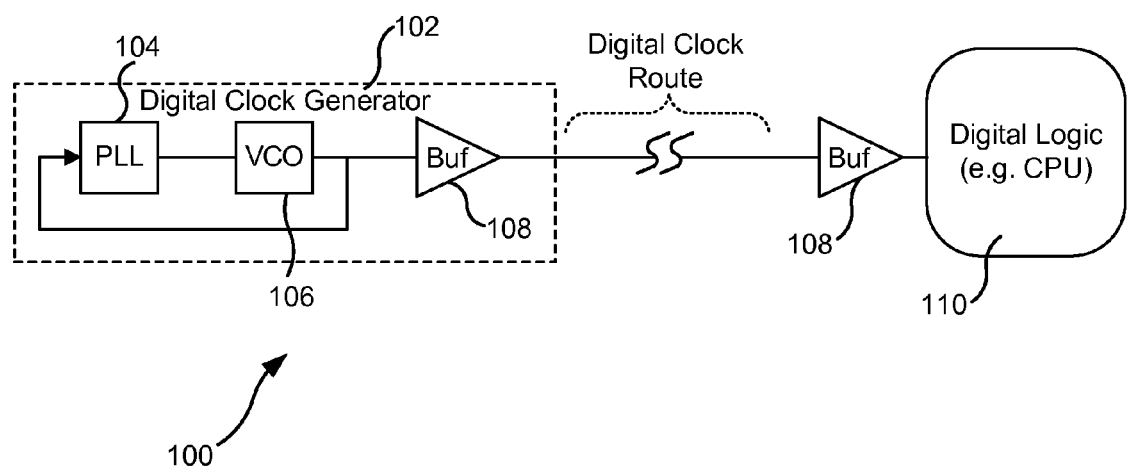
FIG. 1 illustrates a block diagram of a digital circuit, in accordance with certain embodiments of the present disclosure.

FIG. 1 illustrates a block diagram of a digital circuit 100, in accordance with certain embodiments of the present disclosure. Generally, the digital circuit may be part of digital device such as cellphones, base stations, computers, etc. The digital circuit may include a digital clock generator 102 which is connected to a digital logic (e.g., a CPU) 110 through a buffer 108. The digital clock generator may include a PLL 104, a VCO 106 and a buffer 108. The PLL and the VCO may generate a digital clock and send it to the digital logic 110 through a digital clock route. In general, the VCO may be a relaxation oscillator, such as an RC relaxation oscillator, in which R represents a resistor and C represents a capacitor. Relaxation oscillators are well known and are also commonly referred to as Schmitt trigger, RC oscillator, or multi vibrator.

For certain aspects, in an RC relaxation oscillator or any other type of relaxation oscillators, a constant or nearly constant VCO gain over a wide tuning range may be achieved by connecting a parallel cross-coupled differential pair of transistors to the oscillator load. As a result, frequency tuning in the oscillator may be achieved by reducing current in the core of the relaxation oscillator, and simultaneously (or near simultaneously) increasing the current in the cross-coupled differential pair by substantially equal amounts.

Figure 2:
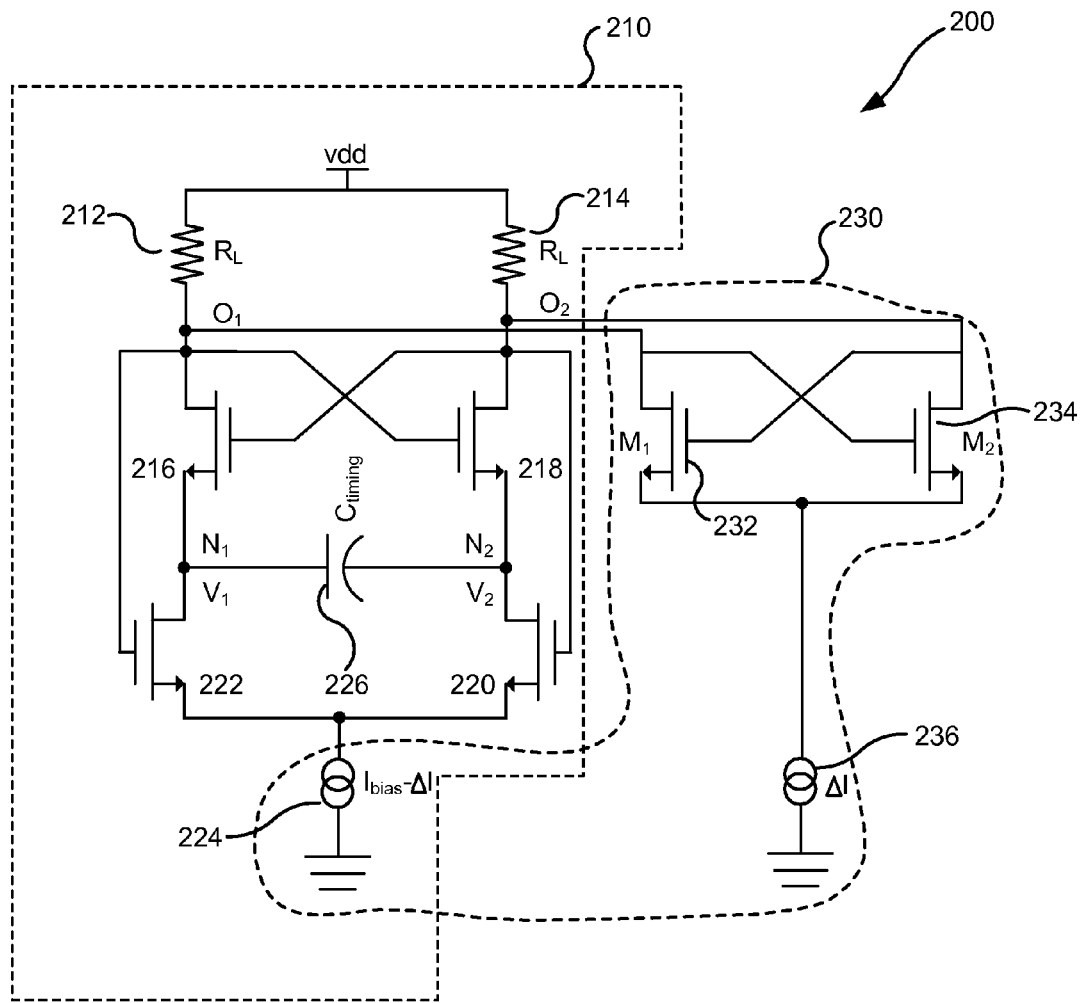
FIG. 2 illustrates an example schematic diagram of an oscillating circuit having a linear gain over a wide frequency range, in accordance with certain embodiments of the present disclosure.

FIG. 2 illustrates an example schematic diagram of an oscillating circuit 200 having a linear gain over a wide frequency range, in accordance with certain embodiments of the present disclosure. Oscillating circuit 200 is shown as including an oscillator 210 and a current compensating block 230. Oscillator 210 may be a conventional relaxation oscillator, which may include resistors 212, 214, transistors 216, 218, 220, 222, and current source 224.

Relaxation oscillator 210 operates as described below. Transistors 216, 218 operate as a comparator thereby enabling current to flow from either node $N_1$ (shown as having voltage $V_1$) to node $N_2$ (shown as having voltage $V_2$) via capacitor 226, or from node $N_2$ to node $N_1$ via capacitor 226. As illustrated, the source terminal of the transistor 216 is connected to the drain terminal of transistor 222 and one of the terminals of the capacitor 226; the gate terminal of transistor 216 is connected to the resistor 214 and the drain terminal of the transistor 218; and the drain terminal of the transistor 216 is connected to the gate terminal of the transistor 218 and one of the terminals of the resistor 212.

Figure 3:
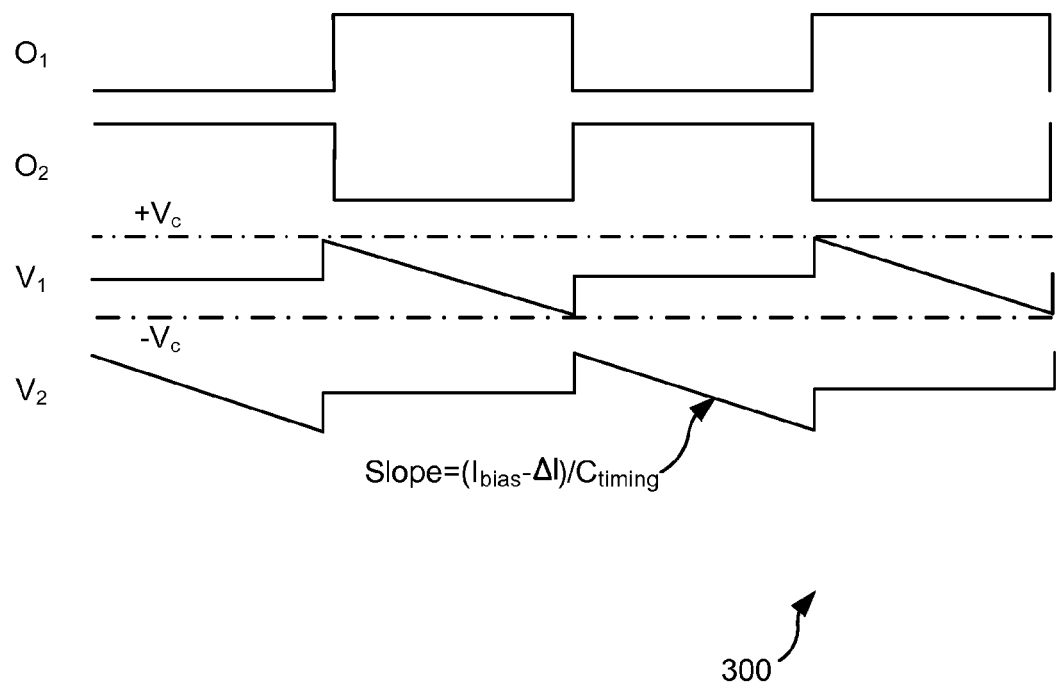
FIG. 3 illustrates an exemplary set of voltage waveforms of selected nodes in the example schematic diagram of the oscillating circuit as illustrated in FIG. 2, in accordance with certain embodiments of the present disclosure.

FIG. 3 illustrates an exemplary set of voltage waveforms 300 of selected nodes in the example schematic diagram of the oscillating circuit 200, in accordance with certain embodiments of the present disclosure. Referring to FIGS. 2 and 3 concurrently, it is seen that, for example, when voltage $V_2$ ramps down, voltage $V_1$ remains constant until $V_2$ reaches a predefined value at which point transistor 218 turns on, in turn causing $V_2$ to remain at a constant level. During the next cycle, $V_1$ ramps down while $V_2$ remains constant. The ramp-down of $V_1$ continues until $V_1$ reaches a predefined value (e.g., $-V_c$) at which point transistor 216 turns on, in turn causing $V_1$ to remain at a constant level.

In a conventional relaxation oscillator and in the absence of current compensation block 230, the amount of voltage drop at node $N_2$ (or $N_1$) required to cause transistor 218 (or 216) to turn on may be defined by $(I_{bias}-\Delta I)*R_L$, where $I_{bias}$ is a fixed current that is supplied by the current source 224, M is a variable current that flows through current source 224 during switching, and $R_L$ represents value of the resistors 212 and 214. It should be noted that the current source 224 supplies both $I_{bias}$ and $\Delta I$ currents. Alternatively, the current source 224 may be replaced by two separate current sources, one supplying a fixed current $I_{bias}$ and the other supplying the current $\Delta I$. In addition, the voltage input in a voltage controlled oscillator or a relaxation oscillator may be converted to current using a voltage to current converter. As an example, the voltage input may be converted into $\Delta I$.

The amount by which voltages $V_1$ and $V_2$ have to ramp down in order for the oscillations to occur determines the oscillation frequency. As is well known, the relaxation oscillator 210 has a nonlinear gain over a wide frequency range.

It should be noted that in a more general oscillating circuit, transistors 220 and 222 may be removed from the example schematic diagram of FIG. 2, and the current source may be replaced with two current sources of magnitude $I_{bias}-\Delta I$ connected to the source terminals of 216 and 218.

Current compensation block 230 is adapted to maintain voltages $V_1$ and $V_2$ within upper and lower bounds of $+V_c$ and $-V_c$. For example, as $V_1$ remains constant, voltage $V_2$ varies from $+V_c$ to $-V_c$. Similarly, as $V_2$ remains constant, voltage $V_1$ varies from $+V_c$ to $-V_c$. In accordance with the present invention, voltages $\pm V_c$ are determined by $I_{bias}*R_L$.

As is seen from FIG. 3, the current compensation block 230 includes a pair of cross-coupled transistors 232, 234—that are coupled to resistors 212, 214—and a current source 236 adapted to supply and/or absorb current $\Delta I$. Therefore, any current in excess of $I_{bias}$ that may be generated during switching in relaxation oscillator 210 is steered to current compensation block 230. Consequently, the current flow through resistors 212, 214 of relaxation oscillator 210 is maintained at $I_{bias}$, in turn causing the upper and lower bounds of voltages $V_1$ and $V_2$ to be at $+V_c$ and $-V_c$, respectively. As is seen from FIG. 2, current compensation block 230 includes a pair of cross-coupled transistors 232, 234 that are connected to the output nodes of the RC oscillator, and a current source 236 adapted to flow current $\Delta I$ steered by oscillating circuit 210.

For certain aspects, frequency of the VCO (e.g., $F_{VCO}$) may be written as follows:

$$F_{VCO} = \frac{I_{bias} - \Delta I}{4 C_{timing} V_c},$$

$$V_c = I_{bias} R_L$$

in which C represents the timing capacitor, $V_c$ represents the maximum amplitude of the voltage on the timing capacitor, and $R_L$ represents the resistive load. Certain aspects of the present disclosure propose a method that keeps the IR drop (in which I represents current and R represents the resistance) on the resistive load constant or nearly constant. Thus, $V_c$ is constant or nearly constant. As a result, frequency becomes a linear function of the current that is passing through the core of the oscillator. The proposed oscillator may operate over a wide frequency range (e.g., 3× or 4×) and maintain integrated phase noise nearly constant. Moreover, the jitter is proportional to the integrated phase noise, and inversely proportional to the oscillator frequency.

Figure 4:
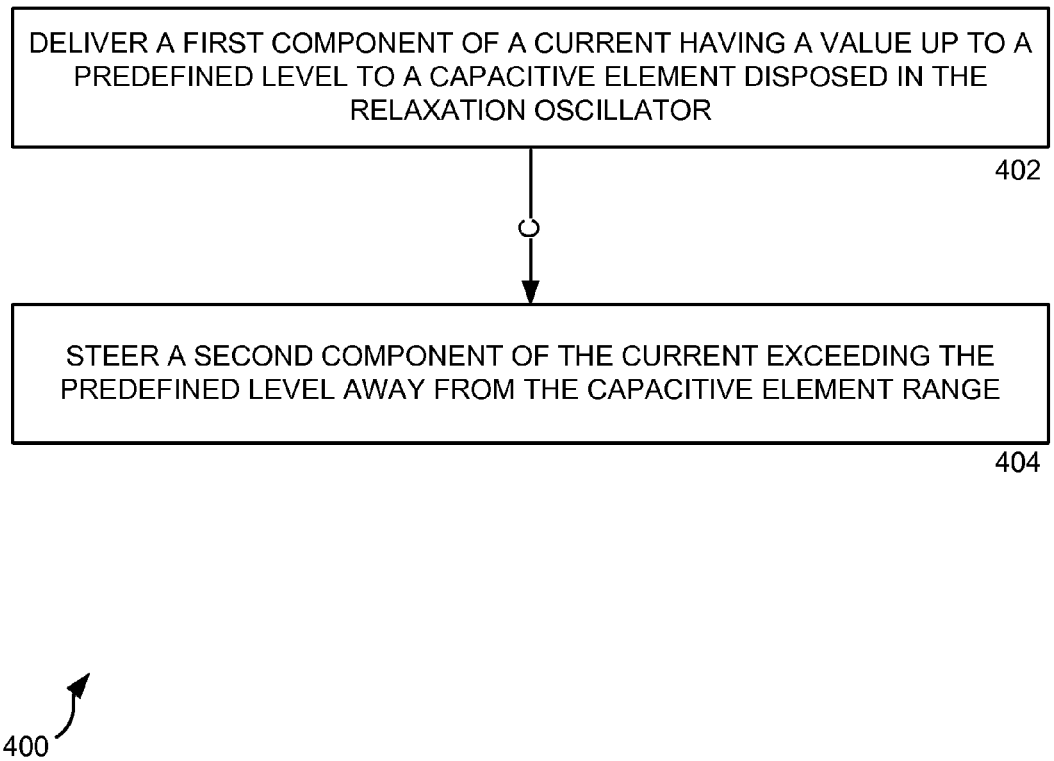
FIG. 4 illustrates an exemplary flowchart for generating an oscillating signal with a linear gain over a wide frequency range, in accordance with certain embodiments of the present disclosure.

FIG. 4 illustrates an exemplary flowchart for generating an oscillating signal with a linear gain over a wide frequency range, in accordance with certain embodiments of the present disclosure. At 402, a first component of a current having a value up to a predefined level is delivered to a capacitive element disposed in a relaxation oscillator. At 404, a second component of the current exceeding the predefined level is steered away from the capacitive element. For certain embodiments, the second component of the current may be smaller than the first component of the current. An oscillating output signal may be generated using the relaxation oscillator.

For certain embodiments, a first pair of cross-coupled transistors may be coupled to the capacitive element. The first pair of cross-coupled transistors may compare a voltage across the capacitive element with a predefined value.

For certain embodiment, a second pair of cross-coupled transistors may be coupled to the relaxation oscillator. The second component of the current exceeding the predefined level may be steered through the second pair of cross-coupled transistors and away from the capacitive element. For certain embodiments, a voltage may be maintained across the capacitive element to a value defined by a resistance of a resistor disposed in the relaxation oscillator and the first predefined current level.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Figure 5:
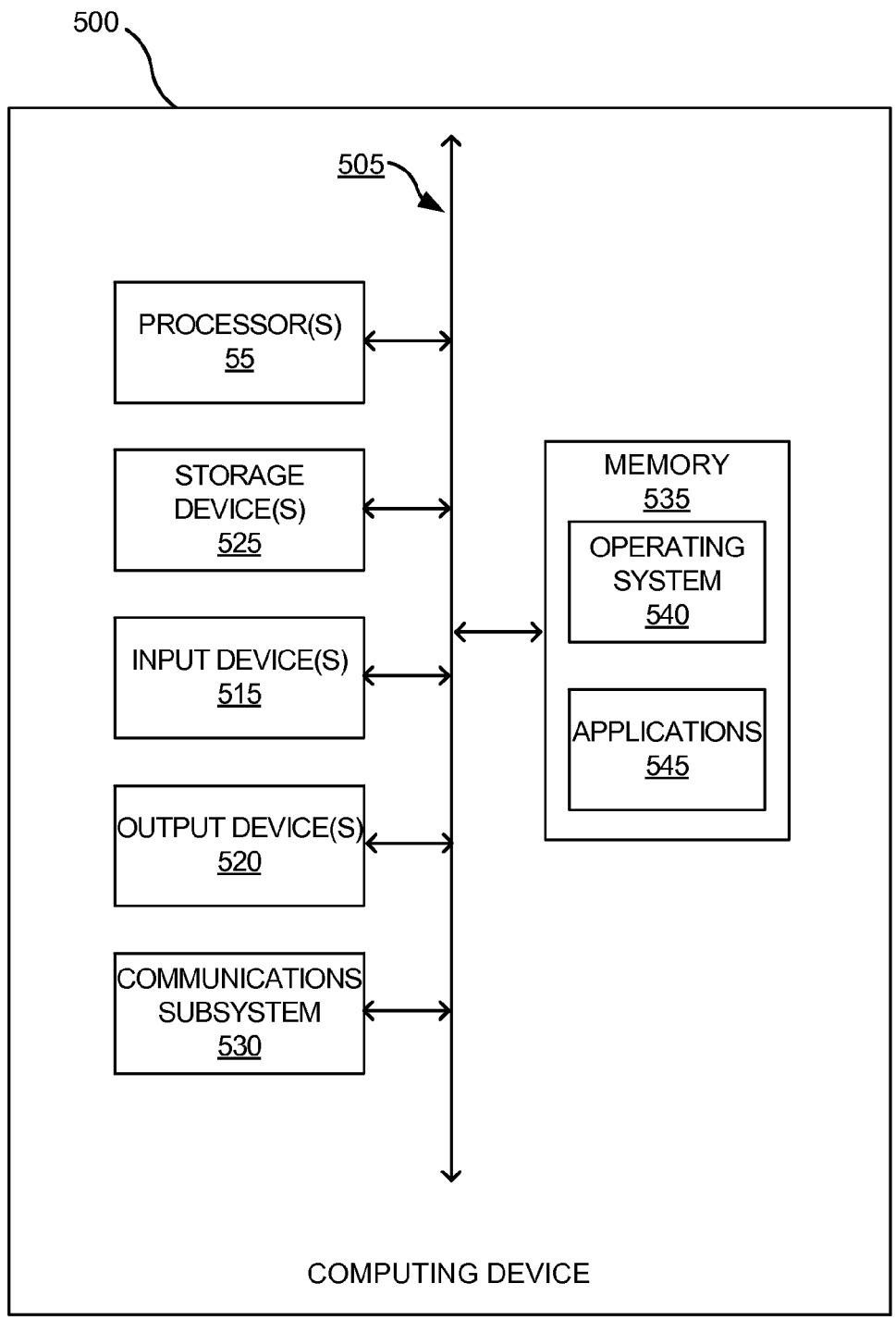
FIG. 5 illustrates an example computing system in which one or more aspects of the disclosure may be implemented.

Having described multiple aspects above, an example of a computing system in which such aspects may be implemented may now be described with respect to FIG. 5. According to one or more aspects, a computer system as illustrated in FIG. 5 may be incorporated as part of a computing device, which may implement, perform, and/or execute any and/or all of the features, methods, and/or method steps described herein. For example, one or more of the processor 510, memory 535, and communications subsystems 530 may be used to implement any or all of the blocks as shown in FIGS. 2 and 4. For example, computer system 500 may represent some of the components of a hand-held device. A hand-held device may be any computing device with an input sensory unit, such as a camera and/or a display unit. Examples of a hand-held device include but are not limited to video game consoles, tablets, smart phones, and mobile devices. In some embodiments, the system 500 is configured to implement the devices 100 or 200 described above. FIG. 5 provides a schematic illustration of one embodiment of a computer system 500 that can perform the methods provided by various other embodiments, as described herein, and/or can function as the host computer system, a remote kiosk/terminal, a point-of-sale device, a mobile device, a set-top box, and/or a computer system. FIG. 5 is meant only to provide a generalized illustration of various components, any and/or all of which may be utilized as appropriate.

The computer system 500 is shown comprising hardware elements that can be electrically coupled via a bus 505 (or may otherwise be in communication, as appropriate). The hardware elements may include one or more processors 510, including without limitation one or more general-purpose processors and/or one or more special-purpose processors (such as digital signal processing chips, graphics acceleration processors, and/or the like); one or more input devices 515, which can include without limitation a camera, a mouse, a keyboard and/or the like; and one or more output devices 520, which can include without limitation a display unit, a printer and/or the like.

The computer system 500 might also include a communications subsystem 530, which can include without limitation a modem, a network card (wireless or wired), an infrared communication device, a wireless communication device and/or chipset (such as a Bluetooth® device, an 802.11 device, a WiFi device, a WiMax device, cellular communication facilities, etc.), and/or the like. The communications subsystem 530 may permit data to be exchanged with a network (such as the network described below, to name one example), other computer systems, and/or any other devices described herein. In many embodiments, the computer system 500 may further comprise a non-transitory working memory 535, which can include a RAM or ROM device, as described above.

The computer system 500 also can comprise software elements, shown as being currently located within the working memory 535, including an operating system 540, device drivers, executable libraries, and/or other code, such as one or more application programs 545.

Various examples have been described. These and other examples are within the scope of the following claims.

What is claimed is:

1. An oscillating circuit, comprising:
   a relaxation oscillator comprising:
      a capacitor;
      a pair of resistors operative to deliver a first current to the capacitor, a second terminal of a first one of the pair of resistors and a second terminal of a second one of the pair of resistors being coupled to a supply voltage; and
      a first current source adapted to generate the first current having a predefined current level; and
   a current compensation block comprising:
      a second current source; and
      a first pair of cross-coupled transistors coupled to the second current source and adapted to steer a current exceeding the predefined current level in the relaxation oscillator away from the capacitor and to the second current source, a drain terminal of a first transistor of the first pair of cross-coupled transistors being coupled to a first terminal of the first one of the pair of resistors, and a drain terminal of a second transistor of the first pair of cross-coupled transistors being coupled to a first terminal of the second one of the pair of resistors.

2. The oscillating circuit of claim 1, wherein said relaxation oscillator further comprises:
   a second pair of cross-coupled transistors forming a comparator.

3. The oscillating circuit of claim 2, wherein
   a first transistor of the second pair of cross-coupled transistors has a source terminal coupled to a first terminal of the capacitor, a gate terminal coupled to a first terminal of the second one of the pair of resistors and a drain terminal coupled to a first terminal of the first one of the pair of resistors; and
   a second transistor of the second pair of cross-coupled transistors has a source terminal coupled to a second terminal of the capacitor, a gate terminal coupled to the first terminal the first one of the pair of resistors and a drain terminal coupled to the first terminal of the second one of the pair of resistors.

4. The oscillating circuit of claim 1, wherein said current compensation block is adapted to maintain a voltage across the capacitor to a value defined by a resistance of the pair of resistors and the predefined current level.

5. The oscillating circuit of claim 1, wherein
   the first transistor of the first pair of cross-coupled transistors has a source terminal coupled to the second current source and a gate terminal coupled to the first terminal of the second one of the pair of resistors, and
   the second transistor of the first pair of cross-coupled transistors has a source terminal coupled to the second current source and a gate terminal coupled to the first terminal of the first one of the pair of resistors.

6. A method for linearizing output of a relaxation oscillator, comprising:
   delivering a first component of a current having a value up to a predefined current level to a capacitive element disposed in the relaxation oscillator, the relaxation oscillator including a first resistor and a second resistor, each having one terminal coupled to a supply voltage; and
   steering a second component of the current exceeding the predefined current level away from the capacitive element through a first pair of cross-coupled transistors in a current compensation block, the first pair of cross-coupled transistors having a first transistor and a second transistor, a drain terminal of the first transistor and a gate terminal of the second transistor coupled to the other terminal of the first resistor, and a drain terminal of the second transistor and a gate terminal of the first transistor coupled to the other terminal of the second resistor.

7. The method of claim 6, further comprising:
   coupling a second pair of cross-coupled transistors to the capacitive element.

8. The method of claim 7, further comprising:
   comparing a voltage across the capacitive element with a predefined value using the second pair of cross-coupled transistors.

9. The method of claim 6, further comprising:
   maintaining a voltage across the capacitive element to a value defined by a resistance of the first resistor and the second resistor in the relaxation oscillator and the predefined current level.

10. The method of claim 6, wherein steering a second component of the current exceeding the predefined current level away from the capacitive element comprises:
    coupling the first pair of cross-coupled transistors in the current compensation block to the relaxation oscillator.

11. The method of claim 6, wherein the second component of the current is smaller than the first component of the current.

12. The method of claim 6, further comprising:
    generating an oscillating output signal using the relaxation oscillator.

13. An apparatus for linearizing output of a relaxation oscillator, comprising:
    means for delivering a first component of a current having a value up to a predefined current level to a capacitive element disposed in the relaxation oscillator, the relaxation oscillator including a first resistor and a second resistor, each having one terminal coupled to a supply voltage; and
    means for steering a second component of the current exceeding the predefined current level away from the capacitive element through a first pair of cross-coupled transistors in a current compensation block, the first pair of cross-coupled transistors having a first transistor and a second transistor, a drain terminal of the first transistor and a gate terminal of the second transistor coupled to the other terminal of the first resistor, and a drain terminal of the second transistor and a gate terminal of the first transistor coupled to the other terminal of the second resistor.

14. The apparatus of claim 13, further comprising:
    means for coupling a second pair of cross-coupled transistors to the capacitive element.

15. The apparatus of claim 14, further comprising:
    means for comparing a voltage across the capacitive element with a predefined value using the second pair of cross-coupled transistors.

16. The apparatus of claim 13, further comprising:
    means for maintaining a voltage across the capacitive element to a value defined by a resistance of the first resistor and the second resistor in the relaxation oscillator and the predefined current level.

17. The apparatus of claim 13, wherein the means for steering a second component of the current exceeding the predefined current level away from the capacitive element comprises:
    means for coupling the first pair of cross-coupled transistors in the current compensation block to the relaxation oscillator.

18. The apparatus of claim 13, wherein the second component of the current is smaller than the first component of the current.

19. The apparatus of claim 13, further comprising:
    means for generating an oscillating output signal using the relaxation oscillator.

* * * * *